United States Patent
Yoon

(10) Patent No.: US 8,975,811 B2
(45) Date of Patent: Mar. 10, 2015

(54) LIGHT EMITTING DISPLAY DEVICE THAT EFFECTIVELY PREVENT FLUORINE DIFFUSION TO THE LIGHT EMITTING LAYER AND METHOD FOR FABRICATING THE SAME

(71) Applicant: Samsung Display Co. Ltd., Yongin, Gyeonggi-Do (KR)

(72) Inventor: Joo Sun Yoon, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/058,715

(22) Filed: Oct. 21, 2013

(65) Prior Publication Data

US 2014/0354139 A1 Dec. 4, 2014

(30) Foreign Application Priority Data

May 28, 2013 (KR) .................. 10-2013-0060516

(51) Int. Cl.
*H01J 1/62* (2006.01)
*H05B 33/12* (2006.01)
*H05B 33/10* (2006.01)

(52) U.S. Cl.
CPC ............... *H05B 33/12* (2013.01); *H05B 33/10* (2013.01)

USPC .......................................... 313/498; 313/502

(58) Field of Classification Search
USPC ................. 313/498–512; 257/98, 40
See application file for complete search history.

(56) References Cited

U.S. PATENT DOCUMENTS 7,863,814 B2 * 1/2011 Mitsuya et al. ............... 313/509
2011/0272715 A1 * 11/2011 Kang et al. ..................... 257/88

FOREIGN PATENT DOCUMENTS

| KR | 1020060018767 A | 3/2006 |
| KR | 1020110031863 A | 3/2011 |
| KR | 1020110115539 A | 10/2011 |
| KR | 1020120047541 A | 5/2012 |

* cited by examiner

*Primary Examiner* — Tracie Y Green
(74) *Attorney, Agent, or Firm* — Cantor Colburn LLP

(57) ABSTRACT

A light emitting display device includes: a substrate; a first electrode disposed on the substrate in each pixel area; an insulating film disposed on the substrate, where a first opening, which exposes the first electrode, is defined in the insulating film; a blocking film disposed on a side surface of the insulating film, which defines the first opening; a light emitting layer disposed in the first opening and on the first electrode, where the light emitting layer is in contact with the blocking film; and a second electrode disposed on the light emitting layer.

20 Claims, 11 Drawing Sheets

LIGHT EMITTING DISPLAY DEVICE THAT EFFECTIVELY PREVENT FLUORINE DIFFUSION TO THE LIGHT EMITTING LAYER AND METHOD FOR FABRICATING THE SAME

This application claims priority to Korean Patent Application No. 10-2013-0060516, filed on May 28, 2013, and all the benefits accruing therefrom under 35 U.S.C. §119, the contents of which in their entireties are herein incorporated by reference.

BACKGROUND

1. Field

Exemplary embodiments of the invention relates to a light emitting display device and a method for fabricating the light emitting display device.

2. Description of the Prior Art

Typically, a flat display device may be classified into a light emitting type and a light receiving type. A light emitting type display device may include a flat cathode ray tube, a plasma display panel, an electroluminescence device or a light emitting diode. A light receiving type display device may include a liquid crystal display. Among light emitting type display devices, the electroluminescence device typically has a wide viewing angle, high contrast and high response speed, and has been noticed as the next-generation display device. Such an electroluminescence device is classified into an inorganic light emitting device and an organic light emitting device based on the material of a light emitting layer thereof.

An organic light emitting device may include a light emitting layer including an organic material disposed between an anode electrode and a cathode electrode. When anode voltage and cathode voltage are applied to the anode and cathode electrodes, respectively, holes injected from the anode electrode move to the light emitting layer through a hole injection layer and a hole transport layer, and electrons move to the light emitting layer through an electron injection layer and an electron transport layer. In the light emitting layer, the electrons and the holes are recombined, such that excitons are generated, and as the excitons are changed from an excited state to a ground state, the light emitting layer emits light to display an image.

Such an organic light emitting device typically includes an insulating film (e.g., pixel-defining film) having an opening that exposes the anode electrode, and the light emitting layer is typically disposed on the anode electrode that is exposed through the opening of the insulating film.

SUMMARY

In an organic light emitting device, where an insulating film include a lyophilic insulating material using a photolithography process, an etching solution that includes fluorine may infiltrate into the insulating film, and thus the insulating film may include fluorine. In such an embodiment, in an organic light emitting device where the insulating film includes a lyophobic insulating material including fluorine, the insulating film may include fluorine.

In such organic light emitting device, fluorine included in the insulating film has high diffusivity, such that fluorine may be diffused into a light emitting layer that is disposed inside an opening and thereby pollute the light emitting layer. When the light emitting layer is polluted, the light emitting efficiency of the light emitting layer may be lowered, thereby degrading the display quality of the light emitting display device, and the light emitting layer may be deteriorated, thereby lowering the lifespan of the light emitting display device.

Accordingly, exemplary embodiments of the invention provide a light emitting display device with improved the display quality and lifespan thereof by effectively preventing pollution of a light emitting layer through effective prevention of fluorine from being diffused from an insulating film to the light emitting layer.

Exemplary embodiments of the invention further provide a method for fabricating the light emitting display device.

Additional features of the invention will be set forth in part in the description which follows and in part will become apparent to those having ordinary skill in the art upon examination of the following or may be learned from practice of the invention.

In an exemplary embodiment of the invention, a light emitting display device includes: a substrate; a first electrode disposed on the substrate in a pixel area of a plurality of pixel areas; an insulating film disposed on the substrate, where a first opening, which exposes the first electrode, is defined in the insulating film; a blocking film disposed on a side surface of the insulating film; a light emitting layer disposed in the first opening and on the first electrode, where the light emitting layer is in contact with the blocking film; and a second electrode disposed on the light emitting layer.

In another exemplary embodiment of the invention, a method for fabricating a light emitting display device includes: providing a first electrode in each pixel area on a substrate; providing an insulating film, and forming a first opening, which exposes the first electrode on the substrate, in the insulating film; providing a blocking film on a side surface of the insulating film; providing a light emitting layer on the first electrode exposed through the first opening, where the light emitting layer is in contact with the blocking film; and providing a second electrode on the light emitting layer.

According to exemplary embodiments of the invention, the blocking film is disposed on the side surface of the insulating film, such that fluorine (F) that is included in the insulating film is effectively prevented from being diffused into the light emitting layer, and thus the light emitting layer is effectively prevented from being polluted. Accordingly, in such embodiment, the light emitting efficiency of the light emitting layer may be effectively prevented from being lowered, thereby improving the display quality of the light emitting display device, and the light emitting layer may be effectively prevented from being deteriorated, thereby improving the lifespan of the light emitting display device.

In such embodiments, the blocking film having the lyophobic property effectively confines the light emitting material for forming the light emitting layer in the first opening of the insulating film, such that the color mixing of the light emitting layer, which may occur as the light emitting material in the first opening of a pixel are passes into the first opening of an adjacent pixel area in the ink jet printing process or nozzle printing process during a process for providing the light emitting layer, may be effectively prevented, and thus the display quality may be effectively prevented from being deteriorated.

BRIEF DESCRIPTION OF THE DRAWINGS

The above and other features of the invention will be more apparent from the following detailed description taken in conjunction with the accompanying drawings, in which.

DETAILED DESCRIPTION

Figure 1:
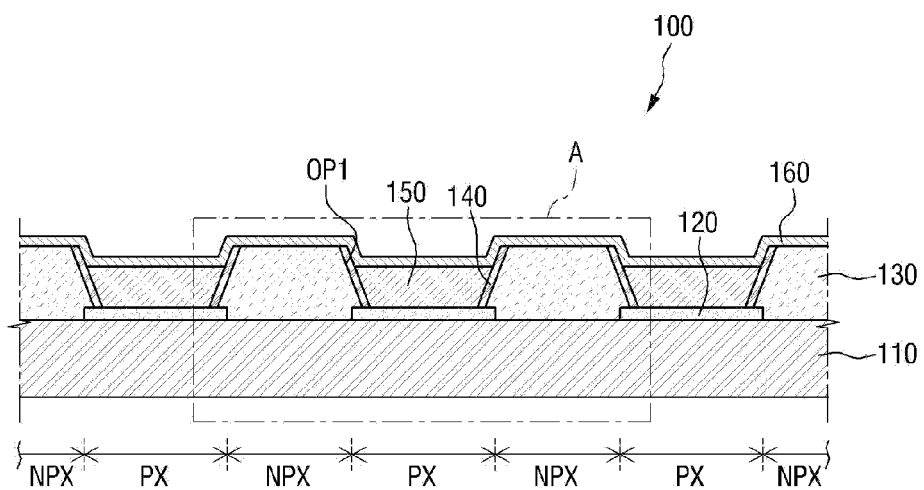
FIG. 1 is a cross-sectional view of an exemplary embodiment of a light emitting display device according to the invention.

The invention will be described more fully hereinafter with reference to the accompanying drawings, in which embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described with reference to the accompanying drawings.

Figure 2:
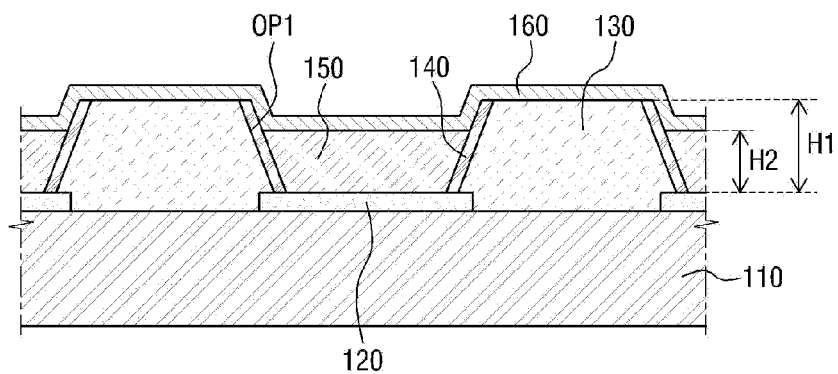
FIG. 2 is an enlarged cross-sectional view of a portion "A" in FIG. 1.

FIG. 1 is a cross-sectional view of an exemplary embodiment of a light emitting display device according to the invention, and FIG. 2 is an enlarged cross-sectional view of a portion "A" in FIG. 1.

Referring to FIGS. 1 and 2, an exemplary embodiment of a light emitting display device 100 according to the invention includes a substrate 110, a first electrode 120, an insulating film 130, a blocking film 140, a light emitting layer 150 and a second electrode 160.

The substrate 110 may include an insulating substrate, in which pixel areas PX and non-pixel areas NPX are defined. In an exemplary embodiment, a pixel area PX may be defined as an area corresponding to the light emitting layer 150 on the substrate 110, and remaining areas may be defined as the non-pixel areas NPX. In an exemplary embodiment, the insulating substrate may include a transparent glass material, e.g., $SiO_2$. In an alternative exemplary embodiment, the insulating substrate may include an opaque material or a plastic material. In an exemplary embodiment, the insulating substrate may be a flexible substrate.

In an exemplary embodiment, although not illustrated, the substrate 110 may further include other structures disposed on the insulating substrate. In such an embodiment, the other structures may include a wiring, an electrode, an insulating film and the like, for example. In an exemplary embodiment, the substrate 110 may include a plurality of thin film transistors disposed on the insulating substrate. A drain electrode of at least one of the plurality of thin film transistors may be electrically connected to a first electrode 120. In an exemplary embodiment, the thin film transistor may include an active region including amorphous silicon, polycrystalline silicon, or monocrystalline silicon, for example. In an alternative exemplary embodiment, the thin film transistor may include an active region including oxide semiconductor.

The first electrode 120 is disposed in each pixel area PX on the substrate 110. The first electrode 120 may be an anode electrode, which receives a signal that is applied to the drain electrode of the thin film transistor and provides holes to the light emitting layer 150, or a cathode electrode, which receives the signal and provides electrons to the light emitting layer 150. The first electrode 120 may function as a transparent electrode or a reflection electrode. In an exemplary embodiment, where the first electrode 120 functions as the transparent electrode, the first electrode 120 may include indium tin oxide ("ITO"), indium zinc oxide ("IZO"), zinc oxide (ZnO), or indium oxide ($In_2O_3$). In an exemplary embodiment, where the first electrode 120 functions as a reflection electrode, the first electrode 120 may include a reflection film including at least one of Ag, Mg, Al, Pt, Pd, Au, Ni, Nd, Ir, Cr or compounds thereof, and ITO, IZO, ZnO, or $In_2O_3$ thereon.

In an exemplary embodiment, the insulating film 130 is disposed in each of the non-pixel areas NPX on the substrate 110 and defines a space (e.g., an opening) that exposes at least a portion of the first electrode 120 in each pixel area PX. In such an embodiment, the insulating film 130 is configured to define a first opening OP1 that exposes the first electrode 120 on the substrate 110, and the light emitting layer 150 is disposed in the first opening OP1 on the first electrode 120.

In an exemplary embodiment, the insulating film 130 may include a lyophilic insulating material, for example, silicon oxide, silicon nitride or silicon oxynitride. In an alternative exemplary embodiment, the insulating film 130 may include a lyophobic insulating material, for example, an insulating material including fluorine. Here, the lyophilic property may mean that a contact angle of the insulating film with respect to a light emitting material of the light emitting layer 150 is equal to or lower than about 10°, and the lyophobic property may mean that the contact angle of the insulating film with respect to the light emitting material of the light emitting layer 150 is equal to or higher than about 50°.

In an exemplary embodiment, where the insulating film 130 includes the lyophilic insulating material, the insulating film 130 may be provided using the lyophilic insulating material through a photolithography process, such that an etching solution that includes fluorine (F) may infiltrate into the insulating film 130, and thus the insulating film 130 may include fluorine (F). In an exemplary embodiment, where the insulating film 130 include the lyophobic insulating material, the insulating film 130 may include the lyophobic insulating material including fluorine (F), such that the insulating film 130 may include fluorine (F).

In an exemplary embodiment, the blocking film 140 is disposed on the side surface of the insulating film 130. The blocking film 140 may include a graphene material that blocks atoms, which are larger than helium (He) atoms and smaller than fluorine (F) atoms, from passing therethrough. In such an embodiment, the blocking film 140 effectively prevents fluorine (F) in the insulating film 130 from being diffused into the light emitting layer 150, and thus effectively prevents the light emitting layer 150 from being polluted, such that the light emitting efficiency of the light emitting layer 150 is effectively prevented from being lowered due to the pollution of the light emitting layer 150. Accordingly, in such an embodiment, the display quality of the light emitting display device 100 is effectively prevented from being deteriorated, and the lifespan of the light emitting display device 100 is effectively prevented from being shortened. In an exemplary embodiment, as shown in FIG. 2, the height H1 of the blocking film 140 with respect to the first electrode 120 may be equal to or higher than the height H2 of the light emitting layer 150 with respect to the first electrode 120. Accordingly, the blocking film 140 effectively prevents the fluorine (F) in the insulating film 130 from being diffused at least into the light emitting layer 150.

In an exemplary embodiment, the blocking film 140 includes a graphene material having the lyophobic property, the light emitting material during a process for providing the light emitting layer 150 may be effectively confined in the first opening OP1 of the insulating film 130. Accordingly, the color mixing of the light emitting layer 150, which may occur as the light emitting material in the first opening OP1 of a pixel area PX passes into the first opening OP1 of an adjacent pixel area PX in the ink jet printing process or nozzle printing process during a process for providing the light emitting layer 150, may be effectively prevented.

The light emitting layer 150 is disposed on the first electrode 120 that is exposed by the first opening OP1 of the insulating film 130, and in contact with the blocking film 140 in the first opening OP1 of the insulating film 130. The light emitting layer 150 emits light through recombination of holes provided from the first electrode 120 and electrons provided from the second electrode 160. In such an embodiment, when the holes and the electrons are provided to the light emitting layer 150, the holes and the electrons are combined to form excitons, and the light emitting layer 150 emits light as the excitons are shifted from an excited state to a ground state. The light emitting layer 150 may include a red light emitting layer that emits red light, a green light emitting layer that emits green light, and a blue light emitting layer that emits blue light, in each pixel area PX. The light emitting layer 150 may include an inorganic material including Se or Zn, or a low-molecular or high-molecular organic material.

The second electrode 160 is disposed on the light emitting layer 150. In such an embodiment, the second electrode 160 may be a cathode electrode that provides electrons to the light emitting layer 150 or an anode electrode that provides holes to the light emitting layer 150. In such an embodiment, the second electrode 160 may function as a transparent electrode or a reflective electrode.

In an exemplary embodiment, the light emitting display device 100 may further include an encapsulation substrate (not shown) that is arranged on an upper portion of the second electrode 160. The encapsulation substrate may be an insulating substrate. In such an embodiment, a spacer may be disposed between the second electrode 160 and the encapsulation substrate. In an alternative exemplary embodiment, the encapsulation substrate may be omitted. In such an embodiment, an encapsulation film including an insulating material may cover the upper portion of the second electrode 160.

Hereinafter, alternative exemplary embodiments of a blocking film of the light emitting display device shown in FIG. 1 will be described.

Figure 3:
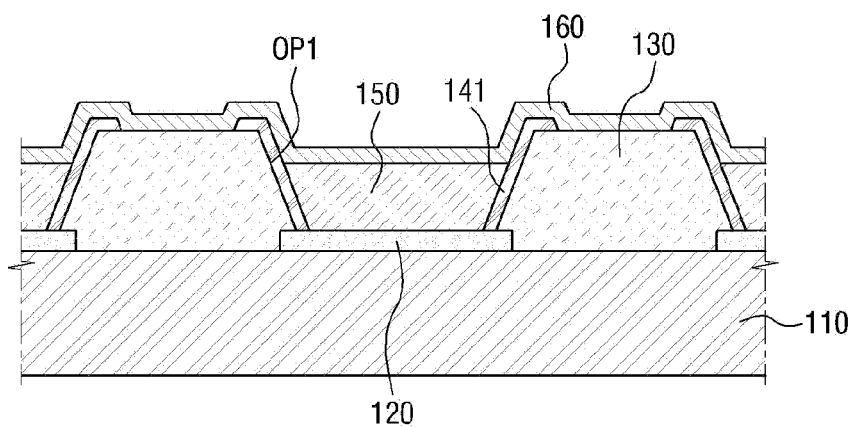
FIGS. 3 and 4 are cross-sectional views showing exemplary embodiments of a blocking film of the light emitting display device of FIG. 1.
Figure 4:
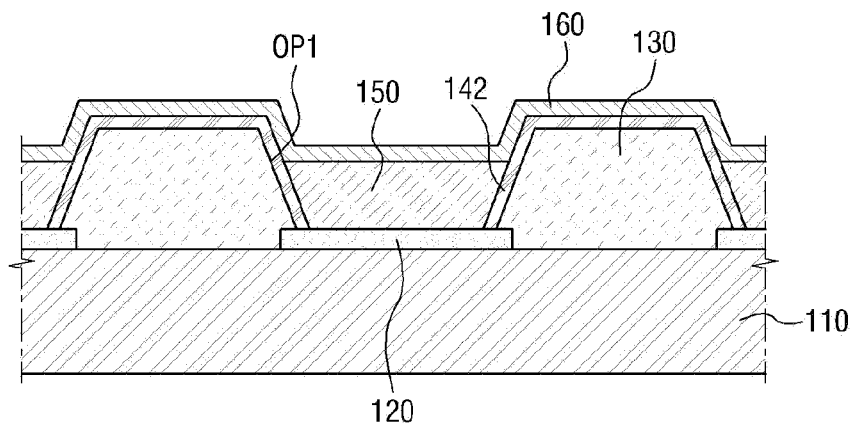

FIGS. 3 and 4 are cross-sectional views showing exemplary embodiments of a blocking film of the light emitting display device of FIG. 1.

FIG. 3 shows an exemplary embodiment of the blocking film 141 that extends in an upper surface direction from the side surface of the insulating film 130 to cover a corner at which the upper surface and the side surface of the insulating film 130 meet each other. In such an embodiment, the blocking film 141 effectively prevent fluorine (F) in the insulating film 130 from being diffused into the light emitting layer 150, and thus effectively prevents the light emitting layer 150 from being polluted. In such an embodiment, the color mixing of the light emitting layer 150, which may occur when the light emitting material in the first opening OP1 of a pixel area PX passes into the first opening OP1 of an adjacent pixel area PX in the ink jet printing process or the like during a process for providing the light emitting layer 150, may be effectively prevented.

FIG. 4 shows an alternative exemplary embodiment of the blocking film 142 that extends from the side surface to the upper surface of the insulating film 130 to cover substantially the entire upper surface of the insulating film 130. In such an embodiment, the blocking film 142 effectively prevent fluorine (F) in the insulating film 130 from being diffused into the light emitting layer 150, and thus effectively prevent the light emitting layer 150 from being polluted. In such an embodiment, the color mixing of the light emitting layer 150, which may occur as the light emitting material in the first opening OP1 of a pixel area PX passes into the first opening OP 1 of an adjacent pixel area PX in the ink jet printing process or nozzle printing process during a process for providing the light emitting layer 150, may be effectively prevented.

As described above, in such embodiments where the light emitting display device 100 includes the blocking film 140 on the side surface of the insulating film 130, the fluorine (F) in the insulating film 130 is effectively prevented from being diffused into the light emitting layer 150, and thus the light emitting layer 150 is effectively prevented from being polluted. Accordingly, in such embodiment, the light emitting efficiency of the light emitting layer 150 is effectively prevented from being lowered, thereby improving the display quality of the light emitting display device 100, and the light emitting layer 150 is thereby effectively prevented from being deteriorated, thereby improving the lifespan of the light emitting display device 100.

In such exemplary embodiments of the light emitting display device 100, the blocking film 140 having the lyophobic property substantially effectively confines the light emitting material during a process for providing the light emitting layer 150 in the first opening OP1 of the insulating film 130 during the process for providing the light emitting layer 150, such that the color mixing of the light emitting layer 150, which may occur as the light emitting material in the first opening OP 1 of a pixel area PX passes into the first opening OP1 of the adjacent pixel area PX in the ink jet printing process or nozzle printing process during the process for providing the light emitting layer 150, may be effectively prevented, and thus the display quality may be effectively prevented from being deteriorated.

Next, an alternative exemplary embodiment of a light emitting display device 200 according to the invention will be described.

Figure 5:
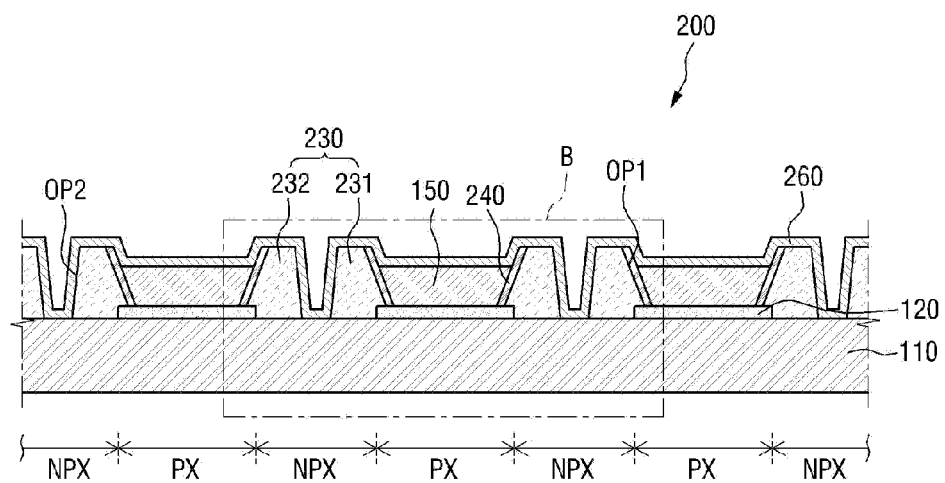
FIG. 5 is a cross-sectional view of an alternative exemplary embodiment of a light emitting display device according to the invention.
Figure 6:
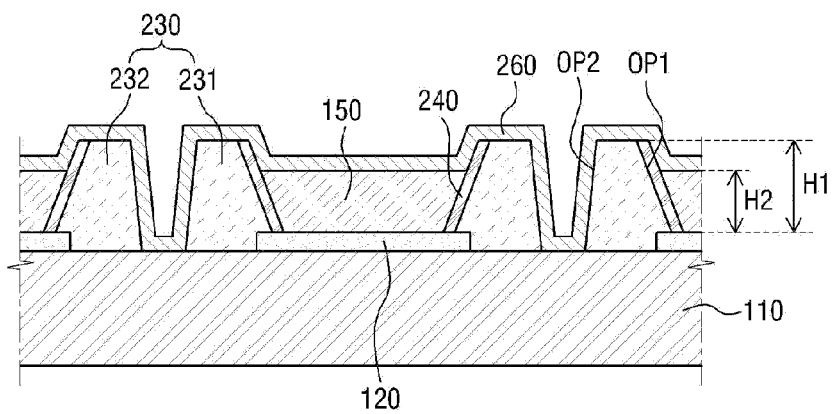
FIG. 6 is an enlarged cross-sectional view of a portion "B" in FIG. 5.

FIG. 5 is a cross-sectional view of an alternative exemplary embodiment of a light emitting display device according to the invention, and FIG. 6 is an enlarged cross-sectional view of a portion "B" in FIG. 5.

The exemplary embodiment of the light emitting display device 200 shown in FIG. 5 is substantially the same as the exemplary embodiment of the light emitting display device 100 of FIG. 1 except for an insulating film 230, a blocking film 240 and a second electrode 260. The same or like elements shown in FIG. 7 have been labeled with the same reference characters as used above to describe the exemplary embodiments of the light emitting display device shown in FIG. 1, and any repetitive detailed description thereof may be omitted or simplified.

Referring to FIGS. 5 and 6, an alternative exemplary embodiment of the light emitting display device 200 according to the invention includes the substrate 110, the first electrode 120, the insulating film 230, the blocking film 240, the light emitting layer 150 and the second electrode 260.

In such an embodiment, a portion of the insulating film 230 in each of the non-pixel areas NPX may be divided into two portions, which are spaced apart from each other. In such an embodiment, the insulating film 230 may include a first portion 231 and a second portion 232 disposed between adjacent pixel areas PX. In such an embodiment, the first portion 231 and the second portion 232 of the insulating film 230 may be spaced apart from each other such that a second opening OP2 may be defined by the space between the first portion 231 and the second portion 232 in each of the non-pixel areas NPX. The second opening OP2 may accommodate a light emitting material, which may get out of the first opening OP1 in the ink jet printing process or the like during a process for providing the light emitting layer 150, and thus may effectively prevent the light emitting material in the first opening OP1 of a pixel area PX from passing into the first opening OP1 of an adjacent pixel area PX. In such an embodiment, the insulating film 230 may include substantially the same material as the insulating film 130 of the exemplary embodiment shown in FIG. 1.

The blocking film 240 is substantially the same as the blocking film 140 of the exemplary embodiment shown in FIG. 1. In an exemplary embodiment, as shown in FIGS. 5 and 6, the blocking film 240 may be disposed on a first side surface of the first portion 231 that defines the first opening OP1 and a first side surface of the second portion 232 that defines the first opening OP1. In such an embodiment, the blocking film 240 may not extend to a second side surface of the side surfaces of the first portion 231 that defines the second opening OP2 among the side surfaces of the first portion 231 and a second side surface of the second portion 232 that defines the second opening OP2.

In such an embodiment, the blocking film 240 effectively prevents the fluorine (F) in the insulating film 230 from being diffused into the light emitting layer 150, and thus effectively prevents the light emitting layer 150 from being polluted. Accordingly, since the light emitting efficiency of the light emitting layer 150 is effectively prevented from being lowered due to the pollution of the light emitting layer 150, the display quality of the light emitting display device 200 may be effectively prevented from being deteriorated, and the lifespan of the light emitting display device 200 may be effectively prevented from being shortened through prevention of the deterioration of the light emitting layer 150. In such an embodiment, since the blocking film 240 effectively confines the light emitting material in the first opening OP1 of the insulating film 230 during a process for providing the light emitting layer 150, the color mixing of the light emitting layer 150, which may occur as the light emitting material in the first opening OP1 of a pixel area PX passes into the first opening OP1 of an adjacent pixel area PX in the ink jet printing process or the like during the process for providing the light emitting layer 150, may be effectively prevented. In such an embodiment, since the blocking film 240 is configured not to extend to the second opening OP2, the light emitting layers 150 between the adjacent pixel areas PX are effectively prevented from being electrically connected to each other even when the graphene material, which is provided as a single layer having no conductivity, has a conductivity.

In such an embodiment, the second electrode 260 is substantially the same as the second electrode 160 of the exemplary embodiment in FIG. 1. In an exemplary embodiment, as shown in FIGS. 5 and 6, the second electrode 260 has a recessed shape in the direction of the substrate 110 in the second opening OP2 by the insulating film 230 that includes the first portion 231 and the second portion 232.

Next, alternative exemplary embodiments of the blocking film of the light emitting display device of FIG. 5 will be described.

Figure 7:
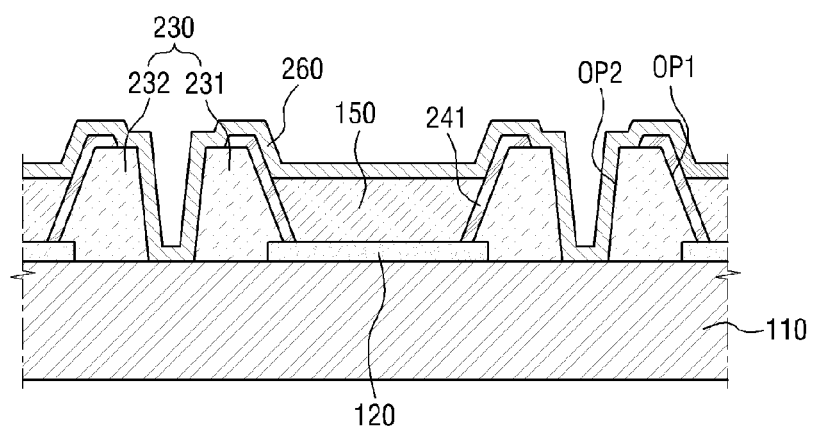
FIGS. 7 and 8 are cross-sectional views showing exemplary embodiments of a blocking film of the light emitting display device of FIG. 5.
Figure 8:
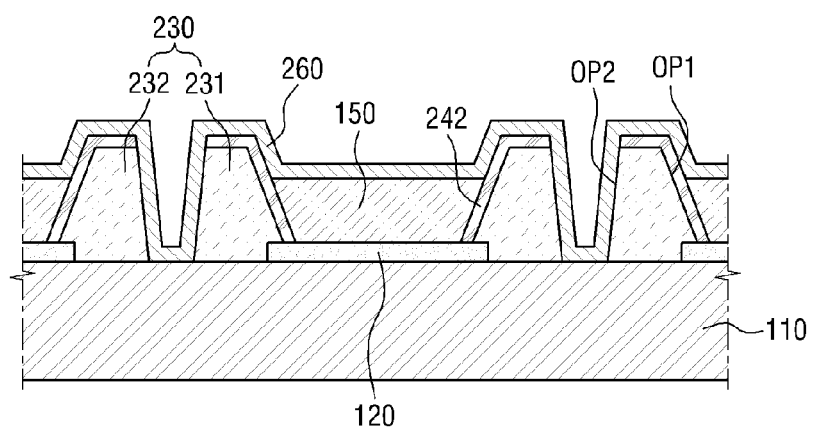

FIGS. 7 and 8 are cross-sectional views showing exemplary embodiments of the blocking film of the light emitting display device of FIG. 5.

FIG. 7 shows an exemplary embodiment of the blocking film 241 that extends to an upper surface of the first portion 231 from the first side surface of the first portion 231 to cover a corner at which the upper surface and the first side surface of the first portion 231 meet each other, and extends to an upper surface of the second portion 232 from the first side surface of the second portion 232 to cover a corner at which the upper surface and the first side surface of the second portion 232 meet each other. In such an embodiment, the blocking film 241 effectively prevents the fluorine (F) in the insulating film 230 from being diffused into the light emitting layer 150, and thus may effectively prevents the light emitting layer 150 from being polluted. In such an embodiment, the blocking film 241 may effectively prevent the occurrence of the color mixing of the light emitting layer 150, which may occur as the light emitting material in the first opening OP 1 of a pixel area PX passes into the first opening OP1 of an adjacent pixel area PX in the ink jet printing process or the like during a process for providing the light emitting layer 150. In such an embodiment, since the blocking film 241 is configured not to be connected to the second opening OP2, the light emitting layers 150 between the adjacent pixel areas PX are effectively prevented from being electrically connected to each other even when the graphene material, which is provided as a single layer having no conductivity, has a conductivity.

FIG. 8 shows an exemplary embodiment of the blocking film 242 that extends from the first side surface to an upper surface of the first portion 231 to cover substantially the entire upper surface of the first portion 231, and extends from the first side surface to an upper surface of the second portion 232 to cover substantially the entire upper surface of the second portion 232. The blocking film 242 may effectively prevent the fluorine (F) in the insulating film 230 from being diffused into the light emitting layer 150, and thus may effectively prevent the light emitting layer 150 from being polluted. In such an embodiment, the blocking film 242 may effectively prevent the occurrence of the color mixing of the light emitting layer 150, which may occur as the light emitting material in the first opening OP1 of a pixel area PX passes into the first opening OP1 of the adjacent pixel area PX in the ink jet printing process or the like during a process for providing the light emitting layer 150. In such an embodiment, since the blocking film 242 is configured not to be connected to the second opening OP2, the light emitting layers 150 between the adjacent pixel areas PX are effectively prevented from being electrically connected to each other even when the graphene material, which is provided as a single layer having no conductivity, has a conductivity.

As described above, in such an embodiment, since the light emitting display device 200 includes the blocking film 240, which is disposed on the side surface of the insulating film 230, or, which is formed on the first side surface of the first portion 231 and the first side surface of the second portion 232, the fluorine (F) in the insulating film 230 is effectively prevented from being diffused into the light emitting layer 150, and thus the light emitting layer 150 is effectively prevented from being polluted. Accordingly, the light emitting efficiency of the light emitting layer 150 may be effectively prevented from being lowered, thereby improving the display quality of the light emitting display device 200, and the light emitting layer 150 may be effectively prevented from being deteriorated, thereby improving the lifespan of the light emitting display device 200.

In such an embodiment of the light emitting display device 200, since the blocking film 240 having the lyophobic property effectively confines the light emitting material in the first opening OP1 of the insulating film 230 during a process for providing the light emitting layer 150, the color mixing of the light emitting layer 150, which may occur as the light emitting material in the first opening OP1 of a pixel area PX passes into the first opening OP1 of the adjacent pixel area PX in the ink jet printing process or nozzle printing process during a process for providing the light emitting layer 150, may be effectively prevented, and thus the display quality may be effectively prevented from being deteriorated.

In such an embodiment of the light emitting display device 200, since the blocking film 240 is configured not to extend to the second opening OP2, the light emitting layers 150 between the adjacent pixel areas PX are effectively prevented from being electrically connected to each other even when the graphene material, which is provided as a single layer having no conductivity, has a conductivity.

Next, an exemplary embodiment of a method for fabricating a light emitting display device 100 according to invention will be described.

Figure 9:
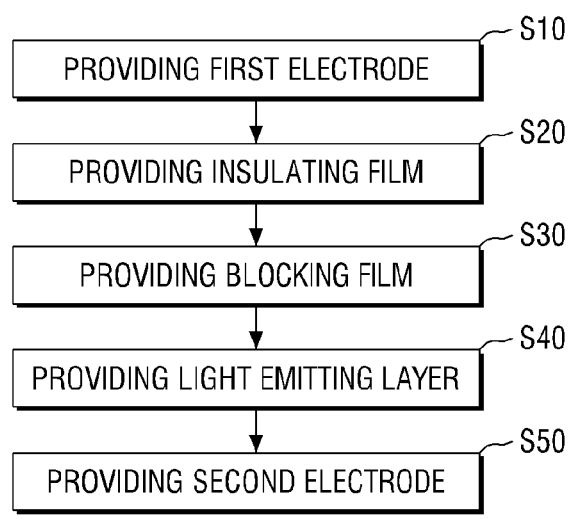
FIG. 9 is a flowchart showing an exemplary embodiment of a method for fabricating a light emitting display device according to the invention.

FIG. 9 is a flowchart of an exemplary embodiment of a method for fabricating a light emitting display device according to the invention, and FIGS. 10 to 16 are cross-sectional views showing an exemplary embodiment of a method for fabricating a light emitting display device according to the invention.

Referring to FIG. 9, the method for fabricating the light emitting display device 100 according to the invention includes providing a first electrode (S10), providing an insulating film (S20), providing a blocking film (S30), providing a light emitting layer (S40), and providing a second electrode (S50).

Figure 10:
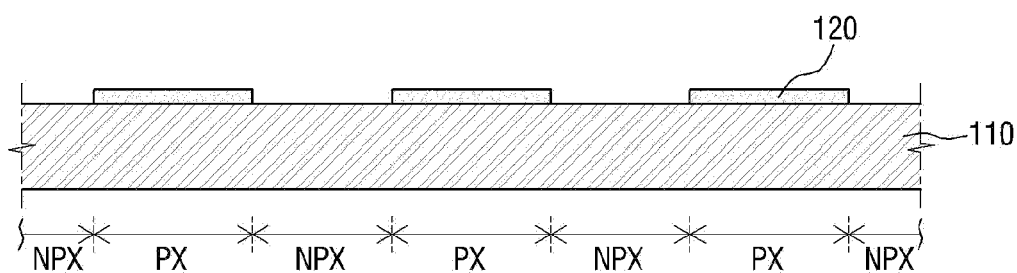
FIGS. 10 to 16 are cross-sectional views showing an exemplary embodiment of a method for fabricating a light emitting display device according to the invention.

Referring to FIG. 10, the first electrode 120 is provided, e.g., formed, on the substrate 110 for each pixel area PX. In such an embodiment, a transparent electrode material or a reflective material may be deposited on the substrate 110, on which a thin film transistor is provided, and the deposited transparent electrode material or the deposited reflective material may be patterned to provide the first electrode 120 on the substrate 110.

Figure 11:
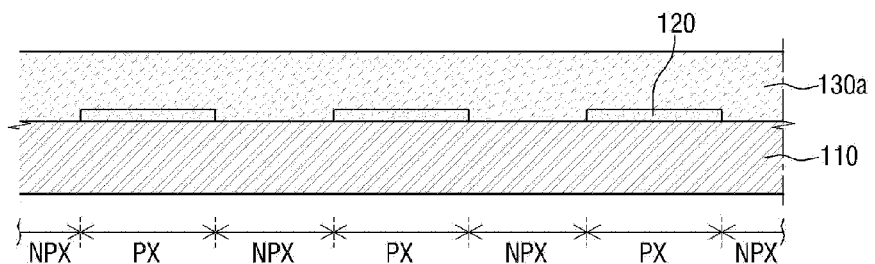
Figure 12:
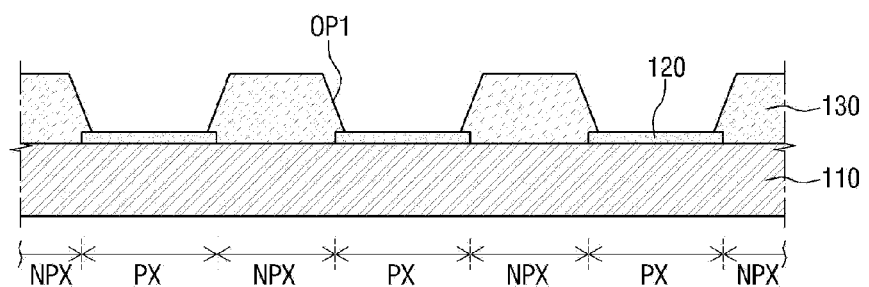

Referring to FIGS. 11 and 12, the insulating film 130 may be provided on the substrate 110, and the first opening OP1 that exposes the first electrode 120 may be formed in the insulating film 130.

In such an embodiment, as illustrated in FIG. 11, an insulating material 130*a* may be deposited on substantially the entire surface of the substrate 110 to cover the first electrode 120 using a deposition method. In such an embodiment, the insulating material 130a may be a material of the insulating film 130, and is substantially the same as the insulating material described above, e.g., the lyophilic insulating material.

Then, as illustrated in FIG. 12, the first opening OP1 is formed in the insulating film 130 by patterning the insulating material 130a using a photolithography process.

Figure 13:
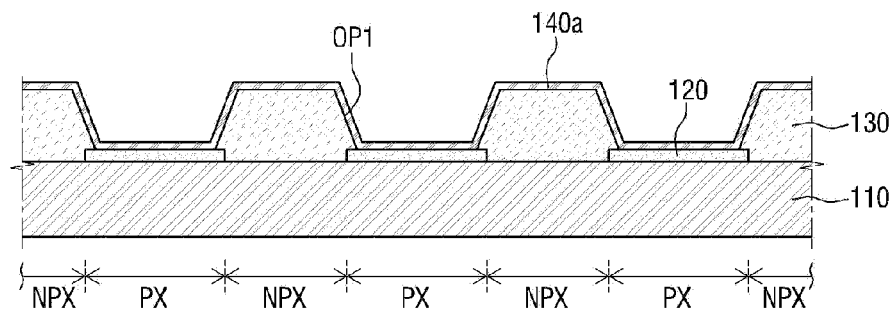
Figure 14:
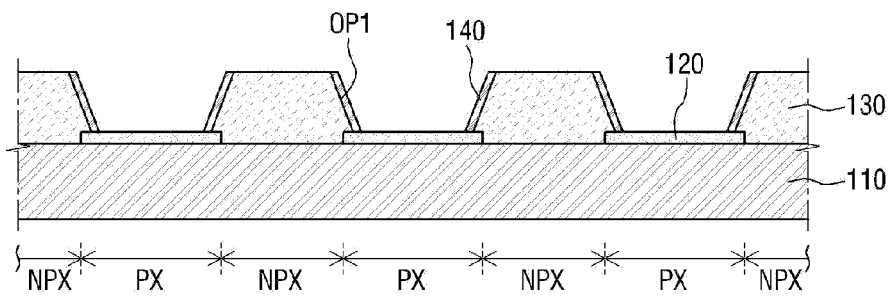

Referring to FIGS. 13 and 14, the blocking film 140 is provided on the side surface of the insulating film 130.

In such an embodiment, as illustrated in FIG. 13, a graphene material 140a may be applied to cover the insulating film 130 and the first electrode 120. The graphene material 140a may be applied through a dipping process, in which the substrate 110, on which the insulating film 130 and the first electrode 120 are provided, is put into and then is taken out from a container that contains a solution of the graphene material 140a, but the method of applying the graphene material 140a is not limited thereto.

Then, the graphene material 140a is patterned using the photolithography process as illustrated in FIG. 14 to provide the blocking film 140. In such an embodiment, a portion of the graphene material 140a that corresponds to a region except for a portion of the graphene material 140a on the side surface of the insulating film 130 may be removed in an etching process using oxygen plasma or ozone plasma in the photolithography process.

Figure 15:
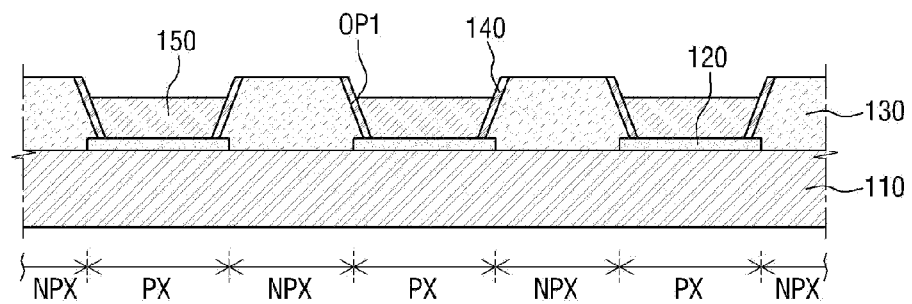

Referring to FIG. 15, the light emitting layer 150 is provided on the first electrode 120 that is exposed through the first opening OP1. In such an embodiment, the light emitting layer 150 may be provided by discharging the light emitting material onto the first electrode 120 that is exposed through the first opening OP1 using the ink jet printing method. The light emitting material includes a material used to provide the light emitting layer 150, and is substantially the same as the light emitting material of the exemplary embodiment of the light emitting layer 150 described above.

Figure 16:
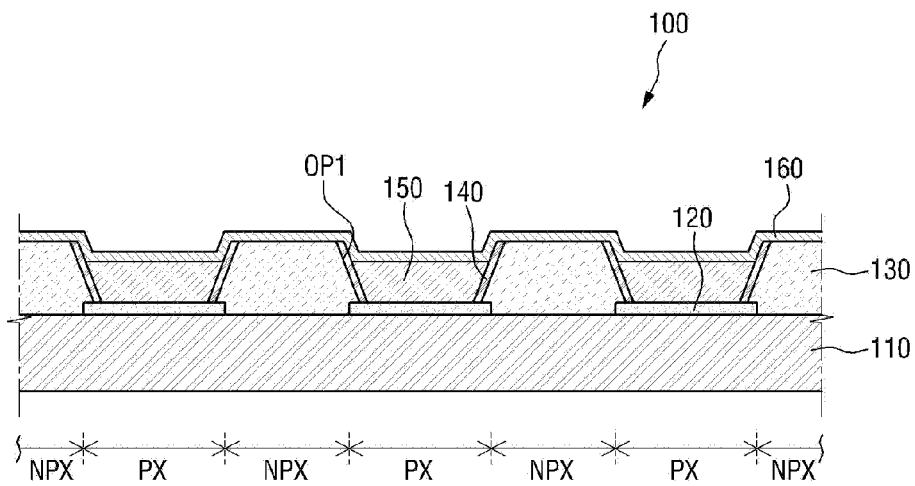

Referring to FIG. 16, the second electrode 160 may be provided by depositing a transparent electrode material or a reflective material on the light emitting layer 150 using a deposition method.

Although not illustrated, an exemplary embodiment of the method for fabricating the light emitting display device 100 may further include providing, e.g., arranging, an encapsulation substrate on an upper portion of the second electrode 160. In such an embodiment, the method for fabricating the light emitting display device 100 may further include providing, e.g., arranging, a spacer between the second electrode 160 and the encapsulation substrate.

Next, an alternative exemplary embodiment of a method for fabricating the light emitting display device 200 according to the invention will be described with reference to FIGS. 17 to 21.

FIGS. 17 to 21 are cross-sectional views showing an alternative exemplary embodiment of a method for fabricating a light emitting display device according to the invention.

In an exemplary embodiment, the method for fabricating the light emitting display device 200 may include the method shown in the flowchart of FIG. 9. The method for fabricating the light emitting display device 200 in FIGS. 17 to 21 is substantially the same as the method for fabricating the light emitting display device 200 shown in FIGS. 10 to 16 except for a process for providing the insulating film, a process for providing the blocking film, and a process for providing the second electrode. The same or like elements shown in FIGS. 17 to 21 have been labeled with the same reference characters as used above to describe the exemplary embodiments of the method for fabricating the light emitting display device 200 shown in FIGS. 10 to 16, and any repetitive detailed description thereof will hereinafter be omitted or simplified.

Figure 17:
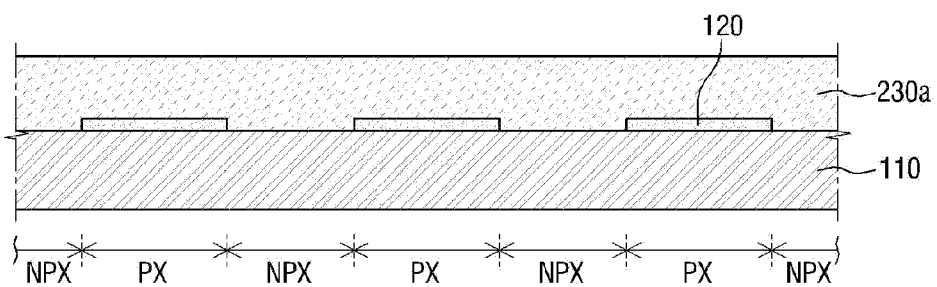
FIGS. 17 to 21 are cross-sectional views showing an alternative exemplary embodiment of a method for fabricating a light emitting display device according to the invention.
Figure 18:
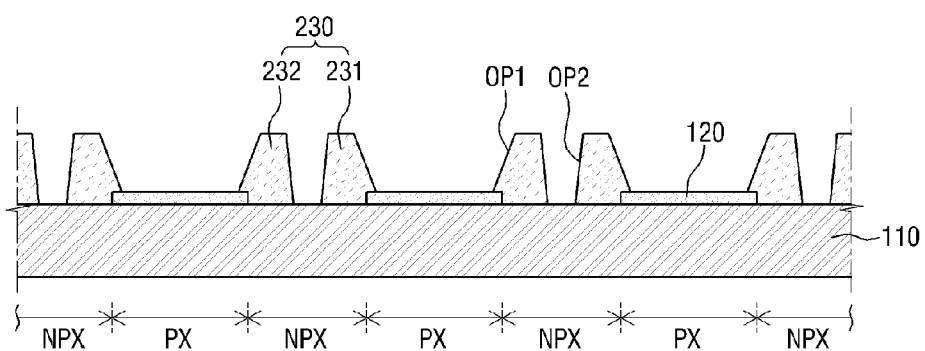

Referring to FIGS. 17 and 18, the insulating film 230 including the first portion 231 and the second portion 232, in which the first opening OP1 is defined by a space that exposes the first electrode 120 between in the adjacent pixel areas PX, and a second opening OP2 is defined between the first portion 231 and the second portion 232, is provided on the substrate 110.

In such an embodiment, as illustrated in FIG. 17, after the first electrode 120 is provided, e.g., formed, on the substrate 110 for each pixel area PX, an insulating material 230a is deposited on substantially an entire surface of the substrate 110 to cover the first electrode 120 using a deposition method. The insulating material 230a is a material substantially the same as the insulating material of the exemplary embodiments described above.

Then, as illustrated in FIG. 18, the insulating film 230 including the first portion 231 and the second portion 232, in which the first opening OP1 corresponding to the first electrode 120 and the second opening OP2 between the adjacent pixel areas PX are defined, is formed by patterning the insulating material 230a using the photolithography process.

Figure 19:
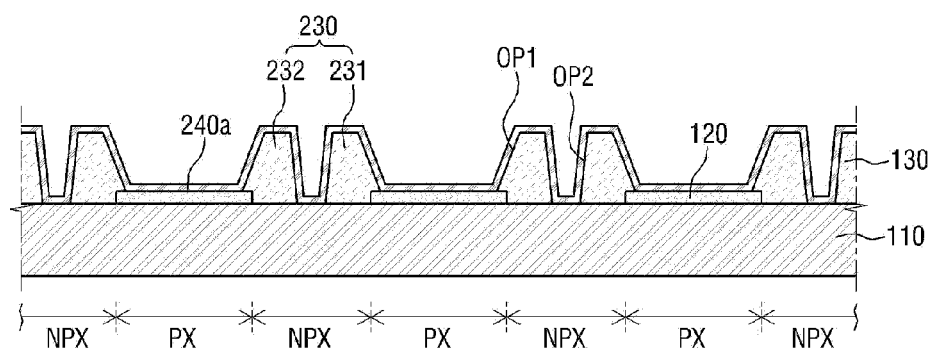
Figure 20:
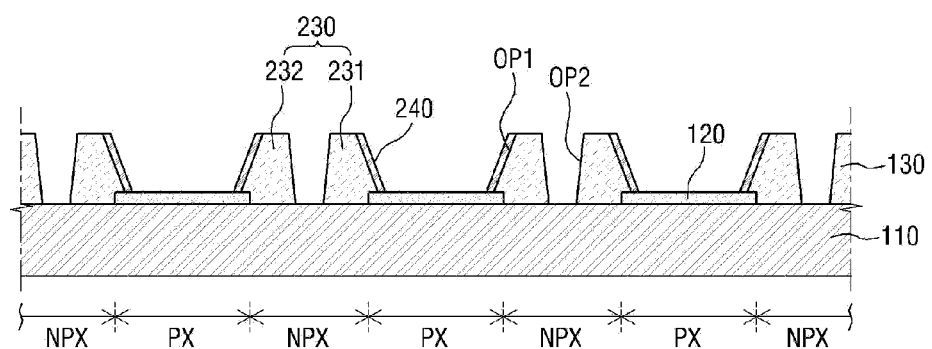

Referring to FIGS. 19 and 20, the blocking film 240 is provided on side surfaces of the insulating film 230.

In such an embodiment, as illustrated in FIG. 19, a graphene material 240a may be applied to cover the insulating film 230 and the first electrode 120. The graphene material 240a may be applied through a dipping process, in which the substrate 110 including the insulating film 230 and the first electrode 120 disposed thereon is put into and then is taken out from a container that contains a solution of the graphene material 240a, but the method of applying the graphene material 240a is not limited thereto.

Then, the blocking film 240 is provided by patterning the graphene material 240a using the photolithography process as illustrated in FIG. 20. In such an embodiment, a portion of the graphene material 240a that corresponds to a region except for the side surfaces of the insulating film 130, that is, a region except for the first side surface of the first portion 231 that defines the first opening OP1 and the first side surface of the second portion 232 that defines the first opening OP1, may be removed in an etching process using oxygen plasma or ozone plasma in the photolithography process.

Figure 21:
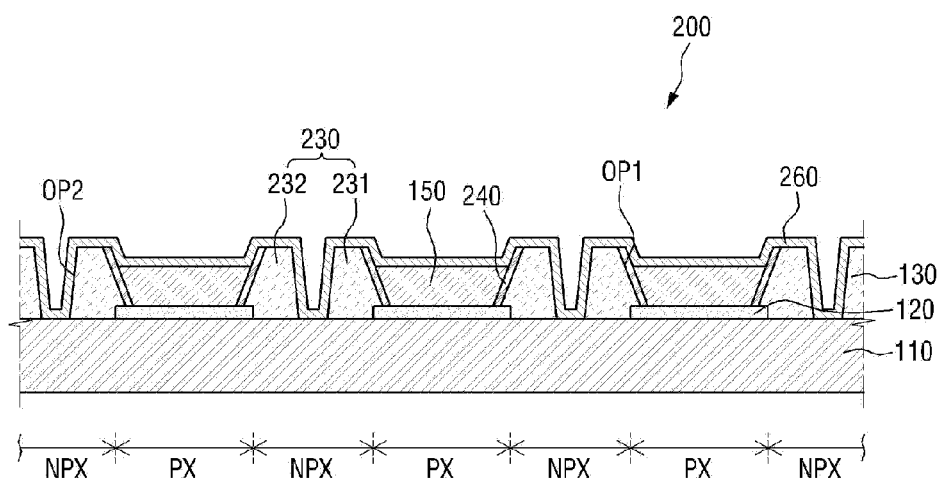

Referring to FIG. 21, the light emitting layer 150 is provided on the first electrode 120 that is exposed through the first opening OP1, and the second electrode 260 is provided by depositing a transparent electrode material or a reflective material on the light emitting layer 150 using a deposition method. The second electrode 260 may have a recessed shape in the direction of the substrate 110 in the second opening OP2 defined by the first portion 231 and the second portion 232 of the insulating film 230.

While the invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A light emitting display device comprising:
   a substrate;
   a first electrode disposed on the substrate in a pixel area of a plurality of pixel areas;

an insulating film disposed on the substrate, wherein a first opening, which exposes the first electrode, is defined in the insulating film;
a blocking film disposed on a side surface of the insulating film, which defines the first opening;
a light emitting layer disposed in the first opening and on the first electrode, wherein the light emitting layer is in contact with the blocking film; and
a second electrode disposed on the light emitting layer.

2. The light emitting display device of claim 1, wherein a height of the blocking film relative to the first electrode is substantially equal to or higher than a height of the light emitting layer relative to the first electrode.

3. The light emitting display device of claim 1, wherein the blocking film extends to an upper surface of the insulating film from the side surface of the insulating film to cover a corner at which the upper surface and the side surface of the insulating film meet each other.

4. The light emitting display device of claim 1, wherein the blocking film extends from the side surface to an upper surface of the insulating film to cover substantially an entire upper surface of the insulating film.

5. The light emitting display device of claim 1, wherein
the insulating film comprises a first portion and a second portion, which are disposed spaced apart from each other between adjacent pixel areas, and
a second opening is defined between the first portion and the second portion of the insulating film.

6. The light emitting display device of claim 5, wherein the blocking film is disposed on a first side surface of the first portion, which defines the first opening, and a first side surface of the second portion, which defines the first opening.

7. The light emitting display device of claim 6, wherein
the blocking film extends to an upper surface of the first portion from the first side surface of the first portion to cover a corner at which the upper surface and the first side surface of the first portion meet each other, and
the blocking film extends to an upper surface of the second portion from the first side surface of the second portion to cover a corner at which the upper surface and the first side surface of the second portion meet each other.

8. The light emitting display device of claim 6, wherein
the blocking film extends from the first side surface to an upper surface of the first portion to cover substantially an entire upper surface of the first portion, and
the blocking film extends from the first side surface to an upper surface of the second portion to cover substantially an entire upper surface of the second portion.

9. The light emitting display device of claim 1, wherein the blocking film comprises a graphene material.

10. The light emitting display device of claim 1, wherein the insulating film comprises a lyophilic insulating material or a lyophobic insulating material comprising fluorine.

11. A method for fabricating a light emitting display device, the method comprising:
providing a first electrode in each pixel area on a substrate;
providing an insulating film, and forming a first opening, which exposes the first electrode on the substrate, in the insulating film;
providing a blocking film on a side surface of the insulating film;
providing a light emitting layer on the first electrode exposed through the first opening, wherein the light emitting layer is in contact with the blocking film; and
providing a second electrode on the light emitting layer.

12. The method of claim 11, wherein the providing the blocking film comprises:
applying a graphene material to cover the insulating film and the first electrode; and
patterning the graphene material.

13. The method of claim 12, wherein the providing the blocking film further comprises using a dipping process.

14. The method of claim 12, wherein the patterning the graphene material comprises removing a portion of the graphene material, which corresponds to a region except for the side surface of the insulating film, using a photolithography process, which comprises performing an etching process using oxygen plasma or ozone plasma.

15. The method of claim 11, wherein a height of the blocking film relative to the first electrode is equal to or higher than a height of the light emitting layer relative to the first electrode.

16. The method of claim 11, wherein
the blocking film extends to an upper surface of the insulating film from the side surface of the insulating film to cover a corner, at which the upper surface and the side surface of the insulating film meet each other, or to cover substantially an entire upper surface of the insulating film.

17. The method of claim 11, wherein the providing the insulating film comprises providing a first portion of the insulating film and a second portion of the insulating film between adjacent pixel areas, wherein a second opening is defined between the first portion and the second portion.

18. The method of claim 17, wherein the providing the blocking film comprises providing the blocking film on a first side surface of the first portion, which defines the first opening, and a first side surface of the second portion, which defines the first opening.

19. The method of claim 18, wherein
the blocking film extends to an upper surface of the first portion from the first side surface of the first portion to cover a corner, at which the upper surface and the first side surface of the first portion meet each other, or to cover substantially an entire upper surface of the first portion, and
the blocking film extends to an upper surface of the second portion from the first side surface of the second portion to cover a corner at which the upper surface and the first side surface of the second portion meet each other, or to cover substantially an entire upper surface of the second portion.

20. The method of claim 11, wherein the insulating film comprises a lyophilic insulating material or a lyophobic insulating material comprising fluorine.

* * * * *